United States Patent
Takaoku et al.

[11] Patent Number: 5,777,464
[45] Date of Patent: Jul. 7, 1998

[54] SPECTRUM ANALYZER

[75] Inventors: Hiroaki Takaoku; Shingo Hashida, both of Tokyo, Japan

[73] Assignee: Advantest Corporation, Tokyo, Japan

[21] Appl. No.: 775,307

[22] Filed: Dec. 31, 1996

[30] Foreign Application Priority Data

Jan. 16, 1996 [JP] Japan ................. 8-005046

[51] Int. Cl.$^6$ .................................................. G01R 23/16
[52] U.S. Cl. .................. 324/76.19; 324/76.23; 324/76.27
[58] Field of Search .................. 324/76.19, 76.21, 324/76.22, 76.23, 76.26, 76.27

[56] References Cited

U.S. PATENT DOCUMENTS

| | | | |
|---|---|---|---|
| 4,839,582 | 6/1989 | Fukaya et al. | 324/76.19 X |
| 4,839,583 | 6/1989 | Takano et al. | 324/76.19 |
| 4,890,099 | 12/1989 | Takano et al. | 324/76.19 X |
| 5,038,096 | 8/1991 | Obie et al. | 324/76.23 |
| 5,210,483 | 5/1993 | Amamoto et al. | 324/76.27 |

*Primary Examiner*—Diep N. Do
*Attorney, Agent, or Firm*—Oblon, Spivak, McClelland, Maier & Neustadt, P.C.

[57] ABSTRACT

The object of a spectrum analyzer of present invention is to increase a frequency stability and SPAN probability. A voltage control oscillator is rendered to a locked state based on a frequency as a reference frequency output from a direct digital synthesizer. Thereafter, the voltage control oscillator performs a sweep operation for a signal output therefrom, based on a frequency error to which a ramp signal is added by an adder, that is, based on the reference frequency output from the direct digital synthesizer.

14 Claims, 2 Drawing Sheets

SPECTRUM ANALYZER

BACKGROUND OF THE INVENTION

1. Field of the Invention

The present invention relates to a spectrum analyzer having a PLL synthesizer in which a sweep operation is performs for a frequency of a signal output therefrom.

2. Description of the Related Art

FIG. 1 is a block diagram showing a constitution example of a conventional spectrum analyzer.

As shown in FIG. 1, the conventional synthesizer is composed of a PLL synthesizer 110 as a LOCAL which generates a signal synchronized with a reference frequency provided from the outside and outputs the signal to a mixer 120; the mixer 120 which multiplies the signal provided from the PLL synthesizer 110 and an observed frequency signal provided from the outside; an amplifier 130 which amplifies a signal multiplied by the mixer 120; an A/D converter 140 which converts the signal amplified by the amplifier 130 to a digital signal; a computing unit 150 which performs computation for the digital signal provided from the A/D converter 140; and a display unit 160 which displays a computing result from the computing unit 150.

FIG. 2 is a block diagram showing a constitution of the PLL synthesizer 110 illustrated in FIG. 1.

As shown in FIG. 2, the PLL synthesizer 110 of the conventional art is composed of a voltage control oscillator 111 which outputs a signal with a frequency according to a voltage value provided; a frequency divider 112 which divides a frequency component of a signal provided from the voltage control oscillator 111; a phase comparator 113 which compares a divided frequency divided by the frequency divider 112 and a reference frequency provided from the outside to output an error voltage; a sample hold circuit 114 which reads the error voltage provided from the phase comparator 113 to output it after holding; and an adder 115 which adds a sweep signal provided from the outside and the error voltage provided from the sample hold circuit 114.

An operation of the PLL synthesizer 110 constructed as above will be described below.

First, a signal with a constant frequency is provided from the voltage control oscillator 111.

Upon receiving the signal from the voltage control oscillator 111, the frequency divider 112 divides the frequency component of the signal provided from voltage control oscillator 111. Then, the phase comparator 113 makes a comparison of the frequency divided in the frequency divider 112 and the reference frequency provided from the outside so that the error voltage is output.

Subsequently, the sample hold circuit 114 reads the error voltage provided from the phase comparator 113 to output it after holding.

Then, the adder 115 adds the sweep signal provided from the outside and the error voltage provided from the sample hold circuit 114. The frequency of the signal output from the voltage control oscillator 111 is regulated based on the voltage value obtained by the operation of the adder 115.

Here, the voltage control oscillator 111 varies the frequency of the signal output therefrom based on a voltage applied thereto upon the application of the voltage provided from the adder 115. Thereafter, the voltage control oscillator 111 is kept at a locked state so that the frequency of the signal output therefrom is constant until the subsequent application of the voltage.

Then, the voltage control oscillator 111 is relieved from its locked state upon the subsequent application of the voltage so that the frequency of the signal to be output therefrom is swept based on a voltage applied.

However, the above described conventional spectrum analyzer inherently involves the following problems.

(1) During the sweep operation of the frequency of the output signal by the voltage control oscillator, the voltage control oscillator is kept free from the locked state, so that a frequency stability and a SPAN probability of the signal output from the voltage control oscillator is reduced.

(2) During the sweep operation of the frequency of the output signal by the voltage control oscillator, the voltage control oscillator is kept free from the locked state, so that a pull-in time becomes longer and a settling time is delayed when the voltage control oscillator is rendered again to be the locked state after completion of the sweep operation.

SUMMARY OF THE INVENTION

The present invention was made in view of the problems involved in the foregoing conventional art. The object of the present invention is to provide a spectrum analyzer which is capable of increasing a frequency stability and a SPAN probability.

To achieve the foregoing object, the present invention comprises, a PLL synthesizer which generates a signal having a frequency synchronized with a synchronizing signal to output the signal therefrom;

a mixer which multiplies the signal provided from said PLL synthesizer and an observed frequency signal provided thereto;

an amplifier which amplifies the multiplied signal by the mixer;

an A/D converter which converts the signal amplified by the amplifier to a digital signal;

a computing unit which computes the digital signal provided from the A/D converter; and a displaying unit which displays a result of computation by the computing unit, wherein said PLL synthesizer varies a frequency of the signal output therefrom based on the synchronizing signal synchronized with a sweep timing of a prescribed frequency.

The foregoing PLL synthesizer comprises, a voltage control oscillator which outputs a signal having a frequency in accordance with a voltage value provided thereto;

a frequency divider which divides a frequency component of the signal provided from the voltage control oscillator;

a direct digital synthesizer which produces a signal having a frequency in accordance with a synchronizing signal provided from the outside synchronized with a sweep timing of a prescribed frequency of a signal and which outputs the signal as a reference frequency;

a phase comparator which compares the frequency of the signal divided in said frequency divider and the reference frequency provided from said direct digital synthesizer to output a frequency error; and an adder which adds a ramp signal and the frequency error provided from the phase comparator, wherein said voltage control oscillator varies the signal output therefrom based on the frequency error added to the ramp signal by said adder.

Furthermore, said PLL synthesizer further comprises a controller which controls said direct digital synthesizer, wherein said synchronizing signal is output to said direct digital synthesizer through the controller.

In the present invention constituted as described above, the voltage control oscillator is rendered to be a locked state based on the frequency as a reference frequency provided from the direct digital synthesizer. Then, the voltage control oscillator performs a sweep operation for a frequency of a signal output therefrom, based on the frequency error to which the ramp signal is added by the adder, that is, the reference frequency of the signal output from the direct digital synthesizer. Accordingly, the sweep operation is performed while the voltage control oscillator is kept in the locked state.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENTS

An embodiment of the present invention will be described with reference to the accompanying drawings below.

Figure 1:
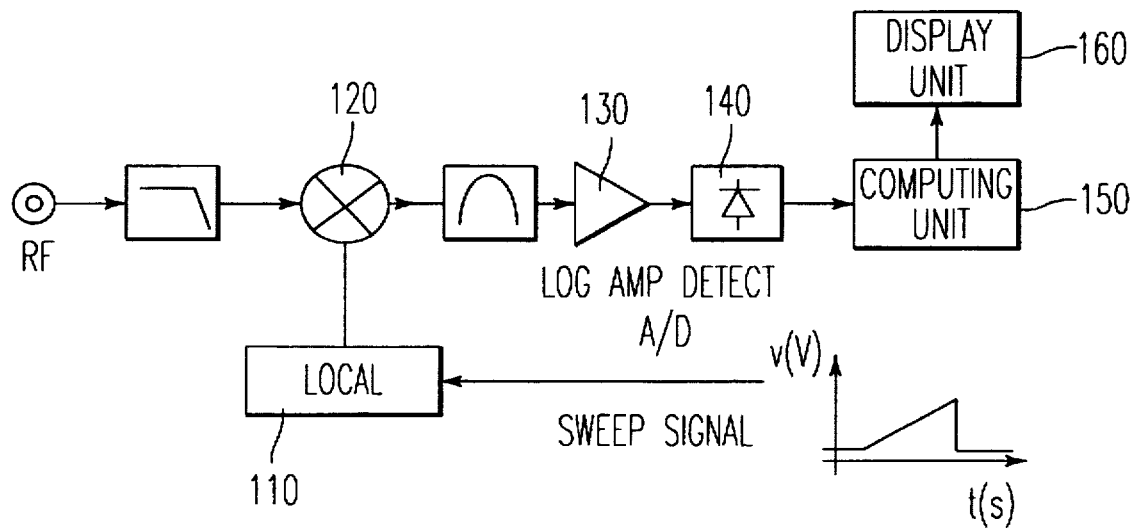
FIG. 1 is a block diagram showing a constitution example of a conventional spectrum analyzer.
Figure 2:
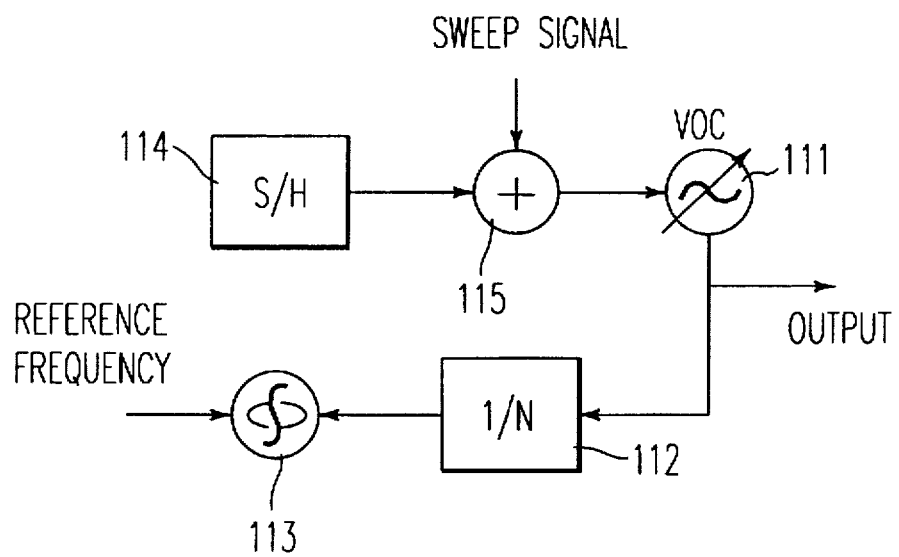
FIG. 2 is a block diagram showing a constitution of a PLL synthesizer illustrated in FIG. 1.
Figure 3:
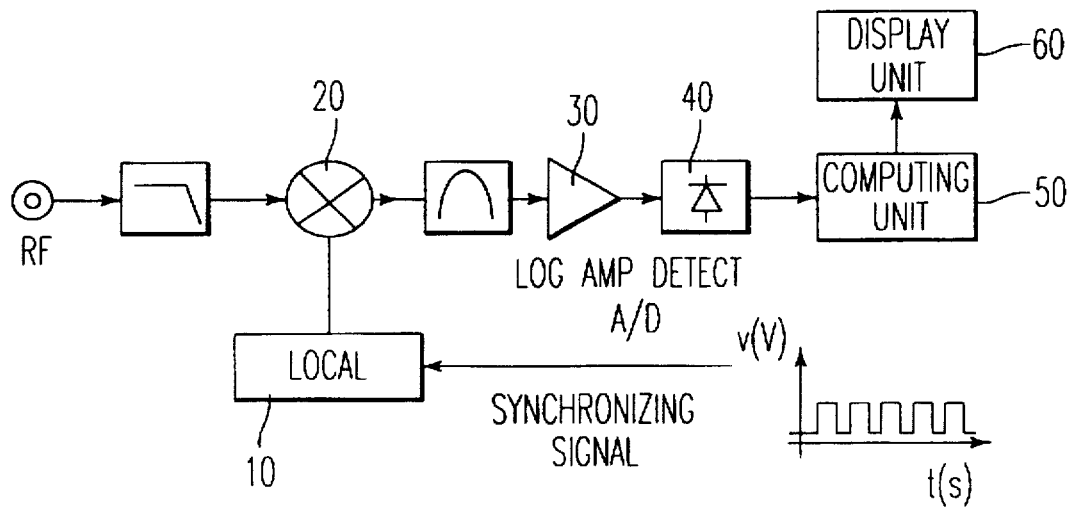
FIG. 3 is a block diagram showing an embodiment of a spectrum analyzer of the present invention.

FIG. 3 is a block diagram showing an embodiment of a spectrum analyzer of the present invention.

As shown in FIG. 3, the spectrum analyzer of this embodiment of the present invention comprises a PLL synthesizer 10 serving as a LOCAL, which produces a frequency signal synchronized with a synchronizing signal provided from the outside and which outputs the frequency signal to a mixer 20; the mixer 20 which multiplies the signal provided from the PLL synthesizer 10 and an observed frequency signal provided from the outside; an amplifier 30 which amplifies a signal multiplied by the mixer 20; an A/D converter 40 which converts the signal amplified by the amplifier 30 to a digital signal; a computing unit 50 which performs computation for the digital signal provided from the A/D converter 40; and a displaying unit 60 which displays a result of the computation by the computation unit 50.

Figure 4:
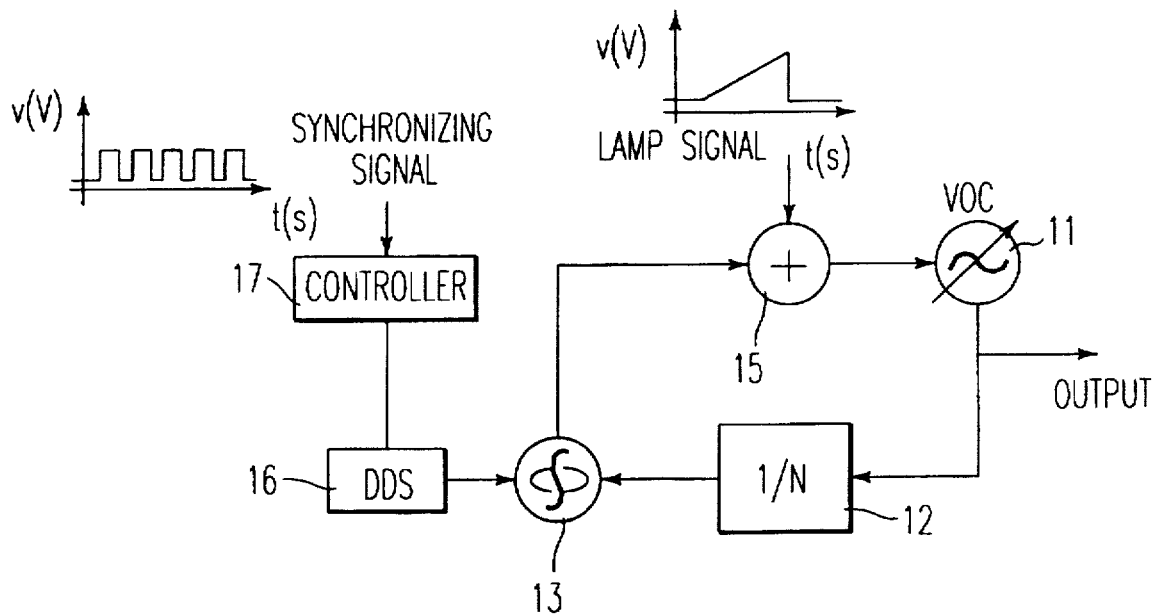
FIG. 4 is a block diagram showing a constitution of a PLL synthesizer illustrated in FIG. 3.

FIG. 4 is a block diagram showing a constitution of the PLL synthesizer 10 illustrated in FIG. 3.

The PLL synthesizer 10 of this embodiment of the present invention, as shown in FIG. 4, comprises a voltage control oscillator 11 which outputs a signal having a frequency in accordance with a voltage value supplied thereto; a frequency divider 12 which divides a frequency component of the signal provided from the voltage control oscillator 11; a direct digital synthesizer 16 which generates a signal having a frequency in accordance with a frequency of a synchronizing signal provided from the outside, which is synchronized with a sweep timing for a prescribed frequency, and which outputs the generated signal as a signal having a reference frequency; a controller 17 which controls the direct digital synthesizer 16, a phase comparator 13 which compares a frequency of the signal divided by the frequency divider 12 and the reference frequency of the signal provided from the direct digital synthesizer 16, and which outputs a frequency error between the frequencies of both signals; and an adder 15 which adds a ramp signal provided from the outside and the frequency error provided from the phase comparator 13.

An operation of the PLL synthesizer 10 which is constituted as described above will be described below.

First, a signal having a certain frequency is output from the voltage control oscillator 11 to the frequency divider 12.

Then, the frequency divider 12 divides a frequency component of a signal provided from the voltage control oscillator 11.

On the other hand, when a synchronizing signal synchronized with a sweep timing for a prescribed frequency is provided, the direct digital synthesizer 16 produces a signal having a frequency in accordance with the synchronizing signal provided to the controller 17 and outputs the signal as a signal having a reference frequency.

Thereafter, the phase comparator 13 compares the frequency of the signal divided by the frequency divider 12 and the reference frequency provided from the direct digital synthesizer 16 to output a frequency error between frequencies of both signals.

Subsequently, the adder 15 adds a ramp signal provided from the outside and the frequency error provided from the phase comparator 13 so that a frequency of a signal output from the voltage control oscillator 111 is controlled based on the frequency obtained by the adder 15.

Here, the voltage control oscillator 11 is rendered to a locked state with respect to the frequency of the signal provided from the direct digital synthesizer 16 as the reference frequency. After that, the voltage control oscillator 11 sweeps the frequency of the signal to be provided therefrom based on the frequency error which is obtained by adding the frequency error between the frequencies of the foregoing both signals provided from the phase comparator 13 and the ramp signal by means of the adder 15, that is, the reference frequency provided from the direct digital synthesizer 16. Thus, the voltage control oscillator 11 performs the sweep operation under the state that it is kept in the locked state.

Furthermore, by adding the ramp signal to the frequency error between the frequencies of the foregoing both signals provided from the phase comparator 13, the frequency error is canceled, so that it will be easier for the voltage control oscillator 11 to follow the direct digital synthesizer 16.

It should be noted that the present invention may be applicable to a sweep of a frequency of a signal generator which is capable of sweeping digitally, other than the sweep of the frequency by the voltage control oscillator described in the foregoing embodiment.

As described above, according to the present invention, the voltage control oscillator is rendered to the locked state with respect to the frequency provided from the direct digital synthesizer using it as the reference frequency. Thereafter, the voltage control oscillator performs the sweep operation for the frequency of the output signal provided therefrom, based on the frequency error obtained by adding the error between the frequencies of the foregoing both signals to the lamp signal with the adder, that is, the reference frequency provided from the direct digital synthesizer. With such constitution, the voltage control oscillator can perform the sweep operation for the frequency while it is kept in the locked state.

Thus, it is possible to prevent the deterioration of a frequency stability and a SPAN probability during the sweep operation for the frequency of the output signal by the voltage control oscillator. In addition, it is possible to delete the pull-in time produced due to rendering the voltage control oscillator to the locked state at time of completion of the sweep operation.

Although the preferred embodiment of the present invention has been described in detail, it should be understood that various changes, substitutions and alternations can be made therein without departing from spirit and scope of the inventions as defined by the appended claims.

What is claimed is:

1. A spectrum analyzer comprising:

a PLL synthesizer which generates a frequency signal synchronized with an external synchronizing signal, and which outputs the frequency signal;

a mixer which multiplies an observed frequency signal and the frequency signal from said PLL synthesizer;

an amplifier which amplifies a signal obtained by the mixer;

an A/D converter which converts the signal amplified by the amplifier to a digital signal;

a computing unit which performs a computing operation for the digital signal provided from the A/D converter; and a displaying unit which displays a result of computation from the computing unit, wherein said PLL synthesizer varies a frequency of said frequency signal based on the external synchronizing signal, and wherein said external synchronizing signal is synchronized with a sweep timing for a predetermined frequency.

2. The spectrum analyzer according to claim 1, wherein said PLL synthesizer comprises:

a voltage control oscillator which outputs a signal having a frequency in accordance with a voltage value provided;

a frequency divider which divides a frequency component of the signal provided from the voltage control oscillator;

a direct digital synthesizer which generates a signal having a frequency in accordance with the external synchronizing signal, which is synchronized with said sweep timing for the predetermined frequency, and which outputs the signal as a signal having a reference frequency;

a phase comparator which compares the frequency of the signal divided by said frequency divider and the reference frequency of the signal provided from said direct digital synthesizer to output a frequency error between the frequencies of both signals; and an adder which adds an external ramp signal and the frequency error output from said phase comparator, and wherein said voltage control oscillator varies a frequency of a signal output therefrom based on the frequency error to which the ramp signal is added by said adder.

3. The spectrum analyzer according to claim 2, wherein said PLL synthesizer further comprises a controller which controls said direct digital synthesizer, and wherein said external synchronizing signal is provided to said direct digital synthesizer through said controller.

4. The spectrum analyzer according to claim 1, wherein said PLL synthesizer comprises:

a direct digital synthesizer which generates a signal having a frequency in accordance with the external synchronizing signal which is synchronized with said sweep timing for the pre determined frequency, and which outputs the signal as a signal having a reference frequency.

5. The spectrum analyzer according to claim 4, wherein said PLL synthesizer further comprises:

a voltage control oscillator which outputs a signal having a frequency in accordance with a voltage value provided;

a frequency divider which divides a frequency component of the signal output by the voltage control oscillator;

a phase comparator which compares the frequency of the signal divided by said frequency divider and the reference frequency of the signal provided from said direct digital synthesizer to output a frequency error between the frequencies of both signals; and an adder which adds an external ramp signal and the frequency error output from said phase comparator.

6. The spectrum analyzer according to claim 5, wherein said voltage control oscillator varies a frequency of a signal output therefrom based on the frequency error to which the ramp signal is added by said adder.

7. The spectrum analyzer according to claim 4, wherein said PLL synthesizer further comprises a controller which controls said direct digital synthesizer, wherein said external synchronizing signal is provided to said direct digital synthesizer through said controller.

8. A spectrum analyzer comprising:

a PLL synthesizer means for generating a frequency signal synchronized with an external synchronizing signal, and which outputs said frequency signal;

means for multiplying an observed frequency signal and said frequency signal output by said PLL synthesizer means;

means for amplifying a signal obtained by said means for multiplying;

means for converting the signal amplified by said means for amplifying to a digital signal;

means for computing an operation of the digital signal output by said means for converting; and means for displaying a result of computation from said means for computing.

wherein said PLL synthesizer means varies a frequency of said frequency signal based on said external synchronizing signal, and wherein said external synchronizing signal is synchronized with a sweep timing for a predetermined frequency.

9. The spectrum analyzer according to claim 8, wherein said PLL synthesizer means comprises:

a voltage control oscillator means for outputting a signal having a frequency in accordance with a voltage value provided;

means for dividing a frequency component of the signal output by said voltage control oscillator means;

a direct digital synthesizer means for generating a signal having a frequency in accordance with the external synchronizing signal which is synchronized with said sweep timing for the predetermined frequency, and for outputting the signal as a signal having a reference frequency;

means for comparing the frequency of the signal divided by said means for dividing and the reference frequency of the signal provided from said direct digital synthesizer means to output a frequency error between the frequencies of both signals; and means for adding an external ramp signal and the frequency error output from said means for comparing, and wherein said voltage control oscillator means varies a frequency of a signal output therefrom based on the frequency error to which the lamp signal is added by said means for adding.

10. The spectrum analyzer according to claim 9, wherein said PLL synthesizer further comprises:

means for controlling said direct digital synthesizer means, wherein said synchronizing signal is provided to said direct digital synthesizer means through said means for controlling.

11. The spectrum analyzer according to claim 8, wherein said PLL synthesizer means comprises:

a direct digital synthesizer means for generating a signal having a frequency in accordance with the external synchronizing signal which is synchronized with said sweep timing for the predetermined frequency, and for outputting the signal as a signal having a reference frequency.

12. The spectrum analyzer according to claim 11, wherein said PLL synthesizer further comprises:

a voltage control oscillator means for outputting a signal having a frequency in accordance with a voltage value provided;

means for dividing a frequency component of the signal output by the voltage control oscillator means;

means for comparing the frequency of the signal divided by said means for dividing and the reference frequency of the signal output by said direct digital synthesizer means to output a frequency error between the frequencies of both signals; and means for adding an external ramp signal and the frequency error output from said means for comparing.

13. The spectrum analyzer according to claim 12, wherein said voltage control oscillator means varies a frequency of a signal output therefrom based on the frequency error to which the ramp signal is added by said means for adding.

14. The spectrum analyzer according to claim 11, wherein said PLL synthesizer means further comprises:

a means for controlling said direct digital synthesizer means, wherein said synchronizing signal is provided to said direct digital synthesizer means through said means for controlling.

* * * * *